(12) United States Patent
Singla et al.

(10) Patent No.: US 11,350,539 B2
(45) Date of Patent: May 31, 2022

(54) COMPUTING DEVICE DOCK

(71) Applicant: Hewlett Packard Enterprise Development LP, Houston, TX (US)

(72) Inventors: Nitin Singla, Bangalore Karnataka (IN); Christopher Affleck, Roseville, CA (US); Vigneshwara Upadhyaya, Bangalore Karnataka (IN); Yashavantha Nagaraju Naguvanahalli, Bangalore Karnataka (IN)

(73) Assignee: Hewlett Packard Enterprise Development LP, Houston, TX (US)

( * ) Notice: Subject to any disclaimer, the term of this patent is extended or adjusted under 35 U.S.C. 154(b) by 240 days.

(21) Appl. No.: 16/582,339

(22) Filed: Sep. 25, 2019

(65) Prior Publication Data
US 2021/0092860 A1 Mar. 25, 2021

(51) Int. Cl.
*H05K 7/14* (2006.01)
*H01R 33/00* (2006.01)
*H01R 13/73* (2006.01)
*H01R 13/518* (2006.01)

(52) U.S. Cl.
CPC ......... *H05K 7/1487* (2013.01); *H01R 13/518* (2013.01); *H01R 13/73* (2013.01); *H01R 33/00* (2013.01)

(58) Field of Classification Search
CPC .... H05K 7/1487; H01R 13/518; H01R 13/73; H01R 33/00
See application file for complete search history.

(56) References Cited

U.S. PATENT DOCUMENTS

| | | | |
|---|---|---|---|
| 6,796,844 B1 | 9/2004 | Edwards, III | |
| 6,857,900 B2 | 2/2005 | Kleeberger et al. | |
| 7,976,346 B2 | 7/2011 | Guy et al. | |
| 9,722,381 B1* | 8/2017 | Moen | H05K 7/1491 |
| 2007/0020976 A1 | 1/2007 | Tirtosupono | |
| 2010/0267251 A1 | 10/2010 | Phu | |
| 2019/0269040 A1* | 8/2019 | Gao | G11B 33/00 |

OTHER PUBLICATIONS

Broadcom, "Support Documents and Downloads", available online at <https://www.broadcom.com/support/download-search?pf=Fibre+Channel+Networking>, retrieved on Mar. 18, 2020, 4 pages.

(Continued)

*Primary Examiner* — James Wu
*Assistant Examiner* — Hung Q Dang
(74) *Attorney, Agent, or Firm* — Hewlett Packard Enterprise Patent Department

(57) ABSTRACT

A system may comprise a dock. The dock may comprise a front. The front may include a front side, wherein a plurality of connectors are disposed on the front side and wherein the plurality of connectors accept external cables, and a rear side, wherein the rear side includes a plurality of extenders and wherein each one of the plurality of extenders connects to one of the plurality of connectors. The dock may comprise a rear including an aperture to allow for insertion of a computing device, wherein the plurality of extenders correspond with and connect to one of a connector on the computing device.

16 Claims, 5 Drawing Sheets

(56) References Cited

OTHER PUBLICATIONS

Cisco, "Bringing Up the Cisco IOS XR Software on a Multishelf System", Cisco IOS XR Getting Started Guide for the Cisco CRS Router, Release 4.2.x, available online at <https://www.cisco.com/c/en/us/td/docs/routers/crs/software/crs_r4-2/getting_started/configuration/guide/gs42crs/gs42mss.html>, Sep. 29, 2016, 34 pages.

Cisco, "Nexus 7000 Chassis Replacement Procedure", available online at <https://www.cisco.com/c/en/us/support/docs/interfaces-modules/nexus-7000-series-supervisor-1-module/119033-technote-nexus-00.html>, Jan. 22, 2018, 6 pages.

Driver Pro, "Hardware drivers and how they work", available online at <https://web.archive.org/web/20190405090539/http://driver-pro.com/related/english/hardware-drivers-and-how-they-work/>, Apr. 5 2019, 1 page.

Wikipedia, "Device driver", available online at <https://en.wikipedia.org/w/index.php?title=Device_driver&oldid=914121380>, Sep. 5, 2019, 6 pages.

\* cited by examiner

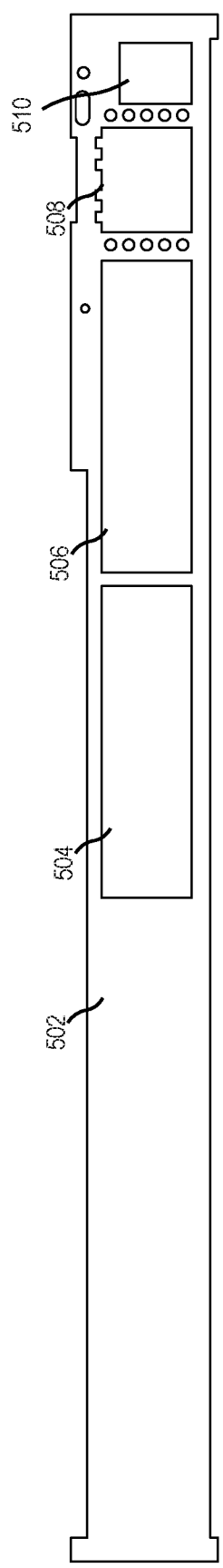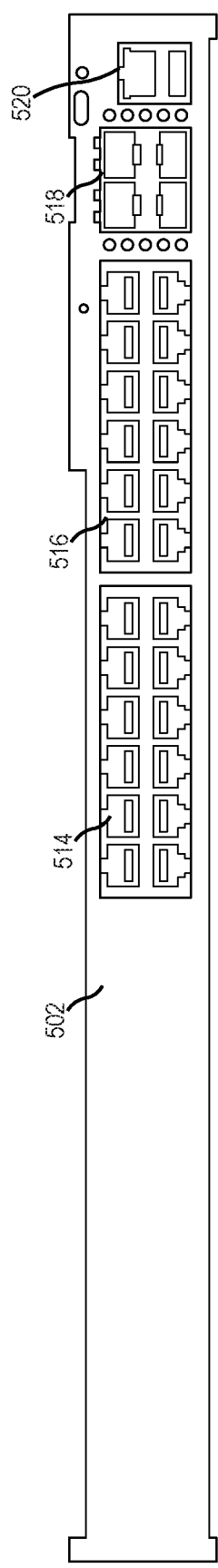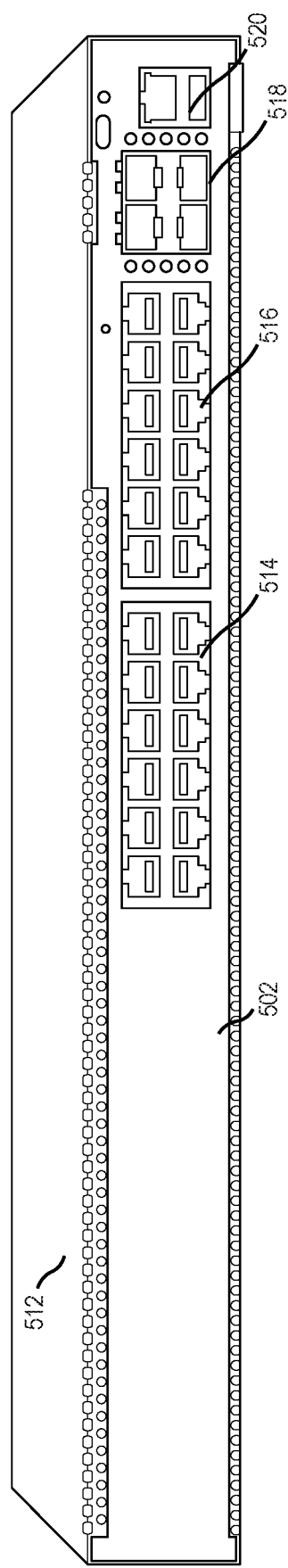

COMPUTING DEVICE DOCK

BACKGROUND

Computing devices may include many connections. When a computing device fails or experiences an issue, the failure or issue may warrant replacement. In such an example, a user (for example, a network administrator) may power down the computing device, ensure connections associated with the computing device are shut off or shut down, disconnect each cable, replace the computing device (either with the same computing device after repair or with another computing device), re-connect each cable to the port that cable was connected to and/or corresponds with, activate or turn on (as well as configure) each connection associated with the computing device, and ensure that each connection is in the proper place. This process allows for the introduction of many potential errors and issues. For example, a user may not follow the proper sequence, a user may connect a cable to the wrong port, a network may be down for a longer the acceptable period of time, or various other issues may arise.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

FIGS. 5A, 5B, and 5C are schematic views of a faceplate, according to an example.

DETAILED DESCRIPTION

Figure 1:
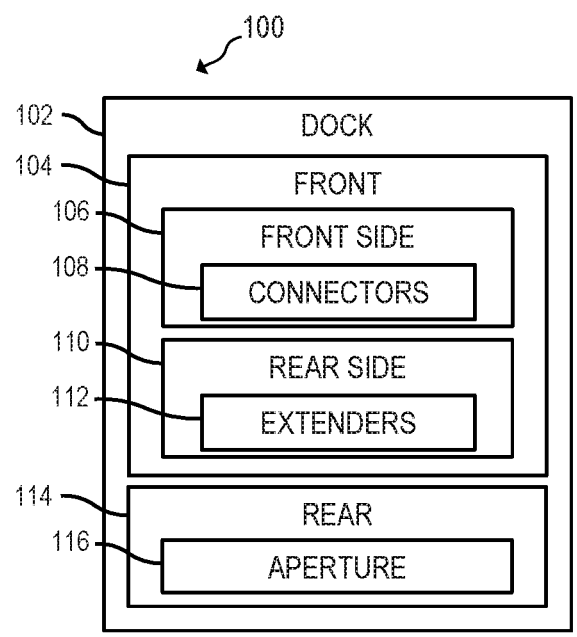
FIG. 1 is a block diagram of a dock, according to an example.

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Computing devices may include many connections. When a computing device fails or experiences an issue, the failure or issue may warrant replacement. In such an example, a user (for example, a network administrator) may power down the computing device, ensure connections associated with the computing device are shut off or shut down, disconnect each cable, replace the computing device (either with the same computing device after repair or with another computing device), re-connect each cable to the port that cable was connected to and/or corresponds with, activate or turn on (as well as configure) each connection associated with the computing device, and ensure that each connection is in the proper place. This process allows for the introduction of many potential errors and issues. For example, a user may not follow the proper sequence, a user may connect a cable to the wrong port, a network may be down for a longer the acceptable period of time, service level agreements may be broken, a loop may be created, or various other issues may arise.

For example, one option for replacing a computing device (for example a switch) may include a phased approach. For the phased approach a user may shut down all physical and virtual links (as well as the ports), then remove all the connections, power down the computing device, and, finally, replacing the computing device. For such a process, a user may re-configure all physical links, virtual links, ports, and connections that were on the initial computing device. A second option for replacing a computing device may include a direct replacement procedure without shutting down the ports. In such examples, all the links may be removed, the connections may be broken, the configuration may be saved, and the computing device may be replaced. Further, the replacement computing device installation may be certified and the connections may be formed again, as per the initial configuration. Such a process may be time consuming.

Based on the issues described above, a dock or faceplate may be utilized to hold, keep, maintain, and/or support connections, physical links, virtual links, and/or connection configurations. In an example, the dock or faceplate may include a front and a rear. The front may include a front side and a rear side. The front side may include connectors. In other words, a plurality of connectors may be disposed on the front side. The connectors may include various types of connections such as registered jacks (RJ), other Ethernet connectors, optical connectors, universal serial bus (USB) connectors, keyboard video and mouse (KVM) connectors, small form-factor pluggable (SFP) connectors, quad small form-factor pluggable (QSFP) connectors, QSFP double density (QSFP-DD) connectors, octal small form-factor pluggable (OSFP) connectors, other serial connectors, other parallel connectors, or some variation thereof. The connectors, as noted by the various supported types, may accept external cables. In other words, the connectors disposed on the front side of the front of the dock may accept cables from other computing devices, such as server devices, storage devices, or networking devices. Further, the rear side may include extenders connected (for example, electrically and/or physically connected) to the connectors on the front side. The extenders may insert into a computing device (For example and as noted, a switch). In other words, when a computing device is inserted into a rack, the ports on the computing device may accept the extenders. The dock or faceplate may include a rear. The rear may include an aperture to allow for insertion of the computing device. The dock or faceplate may include apertures, latches, or fasteners (toolless or otherwise) on the front side to allow for the dock or faceplate to fasten or attach to a rack. The dock or faceplate may include apertures, latches, or fasteners on the rear side of the front to allow for the computing device to fasten or attach to the rear side.

Examples described herein, include a system comprising a dock or faceplate. The dock or faceplate may comprise a front. The front may include a front side and a rear side. The front side may include a plurality of connectors (disposed therein). The plurality of connectors may accept external cables. The rear side may include a plurality of extenders. The rear may include an aperture to allow for insertion of a computing device. The plurality of extenders may correspond with and connect to one of a connector on the computing device FIG. 1 is a block diagram of a dock 102, according to an example. In an example, system 100 may comprise the dock 102. The dock 102 may include a front 104 and rear 114. The front 104 may include a front side 106 and a rear side 110. The front side 106 may include connector 108. In an example, the number of connectors 108 may correspond to a number of connectors or ports on a computing device to be utilized with the dock 102. In another example, the connectors 108 may accept or allow for insertion of external cables. The rear side 110 may include extenders 112. The extenders 112 may be connected to the connectors 108. The extenders 112 may physically, electrically, and/or optically connect to the connectors 108. The rear 114 may include an aperture 116. The aperture 116 may allow for insertion and/or connection of the computing device.

As used herein, a "computing device" may be a storage array, storage device, storage enclosure, server, desktop or laptop computer, networking device, switch, access point, or any other device or equipment including a controller, a processing resource, or the like. In examples described herein, a "processing resource" may include, for example, one processor or multiple processors included in a single computing device or distributed across multiple computing devices. As used herein, a "processor" may be at least one of a central processing unit (CPU), a semiconductor-based microprocessor, a graphics processing unit (GPU), a field-programmable gate array (FPGA) to retrieve and execute instructions, other electronic circuitry suitable for the retrieval and execution instructions stored on a machine-readable storage medium, or a combination thereof.

As used herein, a "machine-readable storage medium" may be any electronic, magnetic, optical, or other physical storage apparatus to contain or store information such as executable instructions, data, and the like. For example, any machine-readable storage medium described herein may be any of Random Access Memory (RAM), volatile memory, non-volatile memory, flash memory, a storage drive (e.g., a hard drive), a solid state drive, any type of storage disc (e.g., a compact disc, a DVD, etc.), and the like, or a combination thereof. Any machine-readable storage medium described herein may be non-transitory.

As used herein, "hot plug" may refer to the act of adding a component or components to a system while the system is powered on and/or running. Further, hot plug may include the continued operation of the system without significant interruption when the component or components are added. In other words, a device may be added to a system while the system is operating and the user or the system itself may perform an administrative task, so that the added device can be utilized. Hot plug may also be referred to with terms such as, hot pluggable, hot plugging, or hot pluggability. For example, a device may be noted to be "hot pluggable".

As used herein, "hot swap" may refer to the act of replacing, removing, or adding a component or components while the system is powered on and/or running. Further, hot swap may include the continued operation of the system without interruption. In other words, in response to a hot swap operation (for example, replacing one device with a new device), a system may operate as normal without interruption. Hot swap may also be referred to with terms such as, hot swappable, hot swapping, or hot swappability. In other words, a device may be noted to be "hot swappable".

As used herein, "rack unit" or "U" may refer to the unit of measurement to define the height of a rack frame and the height of the equipment in a rack frame (such as, computing devices). Each rack unit may be equivalent to 44.50 millimeters or 1.75 inches. For example, a computing device, such as a rack server, may have a height of 2 U or 2 rack units (in other words, 89 millimeters or 3.5 inches).

As used herein, a "blade enclosure" or "blade chassis" may refer to an enclosure or chassis which may accept various computing devices. For example, a blade enclosure may be a metal chassis with a midplane disposed in, approximately, the middle of the blade enclosure. The midplane may include various connections and traces. In such examples, the blade enclosure may accept computing systems (such as, blade servers or half-height blade servers), storage sub-chassis', and/or management modules in the front. The blade enclosure may accept power supplies, cooling devices (such as fans or liquid cooling interfaces), switches, interconnects, management modules, and/or other computing devices. A blade enclosure may be equivalent to 10 U. As used herein, a "blade server" may refer to a computing device of a different height, depth, and width than that of a standard rack server. The blade server, as described above, may rack or be inserted into the front of a blade enclosure. The blade server may offer the same functionality as a rack server, but in a smaller form factor.

As used herein, a "device" may be any microcontroller, BMC, circuit, CPU, microprocessor, GPU, FPGA, chassis manager, rack level manager, other electronic circuitry suitable to communicate with the dock or faceplate and the computing device. For example, the device may be a BMC of a server.

As used herein, a "Baseboard Management Controller" is a specialized service processor that monitors the physical state of a server or other hardware using sensors and communicates with a management system through an independent "out-of-band" connection. The BMC may also communicate with applications executing at the OS level through an input/output controller (IOCTL) interface driver, a Representational state transfer (REST) application program interface (API), or some other system software proxy that facilitates communication between the BMC and applications. The BMC may have hardware level access to hardware devices located in a server chassis. The BMC may be able to directly modify the hardware devices. The BMC may operate independently of the OS of the system that the BMC is located in. The BMC may be located on the motherboard or main circuit board of the server or other device to be monitored. The fact that a BMC is mounted on a motherboard of the managed server or otherwise connected or attached to the managed server does not prevent the BMC from being considered "separate". As used herein, a BMC has management capabilities for sub-systems of a computing device, and is separate from a processing resource that executes an OS of a computing device. The BMC is separate from a processor, such as a central processing unit, executing a high level OS or hypervisor on a system.

As used herein, an "operating system" is machine-readable instructions that may be stored in a machine-readable storage medium and executed by a processing resource. An OS may include system software that manages computer hardware and software resources, as well as providing common services for computer programs. The OS may facilitate communications between a computing devices hardware and applications. The OS may include a user interface that allows a user to interact with the computing device. The OS may include layers, such as an application layer and a kernel layer. High level applications (as in, applications that a user may interact with) may execute at the application layer of an OS, while the kernel layer may include machine-readable instructions that control the computing devices hardware. During the setup or initialization of a computing device, an OS may be installed. During a computing devices boot or start-up process, the OS may load into a machine-readable storage medium. As noted above, a processor or processing resource of the computing device may execute the OS from the machine-readable storage medium. An OS may be another term for "post-boot environment". For example, after the OS is loaded into the machine-readable storage medium, computing device may be in a post-boot environment state. In other words, once a user is able to interact with an OS, the computing device may be considered to be in a post-boot environment.

As used herein, "rack unit" or "U" may refer to the unit of measurement to define the height of a rack frame and the height of the equipment in a rack frame (such as, computing devices). Each rack unit may be equivalent to 44.50 millimeters or 1.75 inches. For example, a computing device, such as a rack server, may have a height of 2 U or 2 rack units (in other words, 89 millimeters or 3.5 inches).

FIG. 1, as noted above, is a block diagram of a dock 102, according to an example. In another example, the dock 102 may attach to a rack. In such examples, the dock 102 may include apertures, latches, or fasteners on the front 104. For example, the front 104 may include apertures that align with apertures on columns of a rack. A user may add a fastener through the aperture on the front 104 and into apertures of the columns on the rack. In another example, the front 104 may include fasteners on the rear side 110. In such examples, the fasteners may fit into apertures on the columns of the rack. Further the fasteners may be thumbscrews, latches, screws, protrusions, or some other toolless mechanism or fastener suitable to attach the dock 102 to the rack. In another example, the dock 102 may attach to an enclosure or chassis. For example, the dock 102 may attach to a blade enclosure. Further, the dock 102 may attach to the rear of the blade enclosure, where switches may be disposed.

In another example, the rear side 110 may include latches, fasteners, apertures, or some other means to secure a computing device to the dock 102. In such examples, the computing device may include corresponding latches, fasteners, or apertures. In such examples, a user may secure the dock 102 to the rack. Once the dock 102 is secured, the user may insert a computing device into the rack from the side opposite the dock 102. When the computing device is fully inserted into the rack, ports or connections on the computing device may pass through the aperture 116 of the rear 114 of the dock 102 and the extenders 112 on the rear side 110 of the dock 102 may insert into corresponding ports or connections of the computing device. In another example, a user may attach the dock 102 to a blade enclosure. Prior to adding the dock 102, a user may add the computing device (such as a blade server or switch). Once the computing device is inserted into the blade enclosure, a user may add the dock 102 and start adding external cables to the dock 102. In the event of computing device failure, a user may simply remove the dock 102, remove the computing device (e.g., blade server or switch), replace the computing device with another computing device, and add the dock 102 back to the blade enclosure.

In another example, the amount and/or type of connectors 108 and extenders 112 on the dock 102 may vary. In such examples, the front 104 of the dock 102 may include cutouts or large apertures. Further, the cutouts may allow for addition of various connectors and/or extenders. For example, a computing device may utilize a certain number of ports or connections (such as a switch with multiple Ethernet ports). A dock 102 with a static amount of connectors 108 and extenders 112 may be able to support certain computing devices. To allow for support of a larger spectrum of computing devices, the dock 102, as noted, may include a variable number of connectors 108 and extenders 112. The aperture or cutout in the dock 102 may include latches or fasteners to allow for addition of different numbers and types of connectors 108 and extenders 112. In such examples, a user may fasten or attach a dock 102 to a rack. As stated, the dock 102 may include an aperture or cutout. The user may procure or select a combined connector and extender assembly corresponding to a computing device to be attached to the dock. The user may attach the connector and extender assembly or multiple connector and extender assemblies to the dock 102. Finally, the user may insert the computing device into the rack and dock 102.

In another example, the dock 102 may include a circuit. In an example, the circuit may be connected to each of the connectors 108 and extenders 112. In another example, the circuit may connect to a management port on a computing device. In another example, the circuit may be connected to a management port disposed on the front side 106 of the front 104 of the dock 102. The circuit may allow for external management of the dock 102. For example, a user may connect to the management port and perform management functionality, such as, but not limited to, monitor functionality of the connectors 108, monitor functionality of the extenders 112, and/or continue to keep external cables active or up if the computing device fails. In another example, management functionality may be accessible through the user interface associated with a device of a computing device. In an example, the device may be a BMC. In such examples, a user may monitor functionality of the dock 102 through the user interface of the BMC or other management circuit.

In another example, machine-readable instructions or a software driver may be installed on the circuit. In another example, corresponding machine-readable instructions or a corresponding driver may be installed on the computing device. The machine-readable instructions and corresponding machine-readable instructions may allow the computing device and dock to communicate.

In another example, the dock may maintain configuration data of the external cables. The configuration data may be stored in the circuit described above or in a machine-readable storage medium located somewhere (such as the rear side 110) on the dock 102. In such examples, the circuit may connect with the machine-readable storage medium. In another example, if a computing device fails and is replaced, the external cables, connectors 108, and extenders 112 may remain configured. In other words, the replacement computing device may utilize the configuration data, rather than re-configure the external cables, connectors 108, and extenders 112. In such examples, the circuit may provide the configuration data to the replacement computing device. In other examples, the circuit may maintain service level agreements.

In another example, the dock 102 may draw power from the computing device through a connection on the rear side 110 which may connect to the computing device. In another example, the dock 102 may draw power from a power storage component (such as a battery), through an outlet coupled to a power source or power supply, and/or through a Power over Ethernet connection (PoE). In such examples, while the dock 102 receives power, the dock 102 may maintain the configuration data, maintain the signals from the external cables, and/or keep the external in an active or inactive state.

In another example the dock 102 (or a faceplate) may be hot swappable or hot pluggable. In such examples, once a user has connected various external cables to the dock 102 (or a faceplate), a user may connect a computing device to the dock 102 (or faceplate) without regard to powering off the computing device.

Figure 2A:
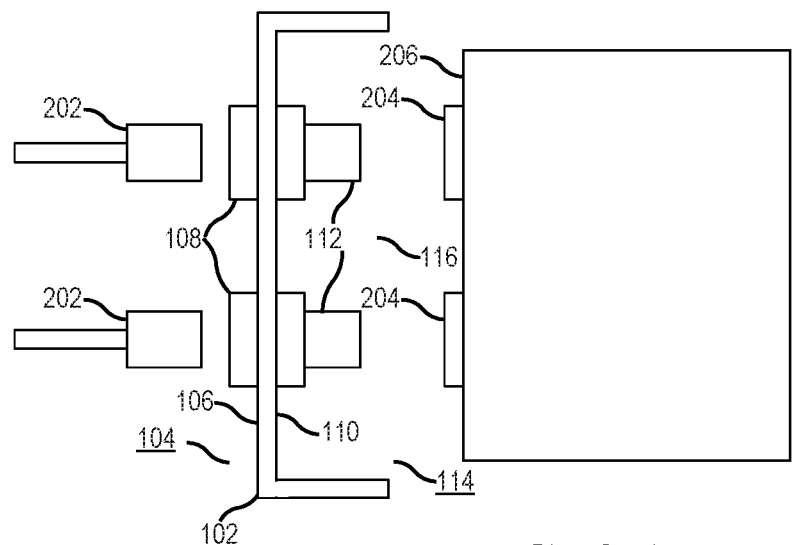
FIGS. 2A and 2B are block diagrams of a dock and computing device, according to examples.
Figure 2B:
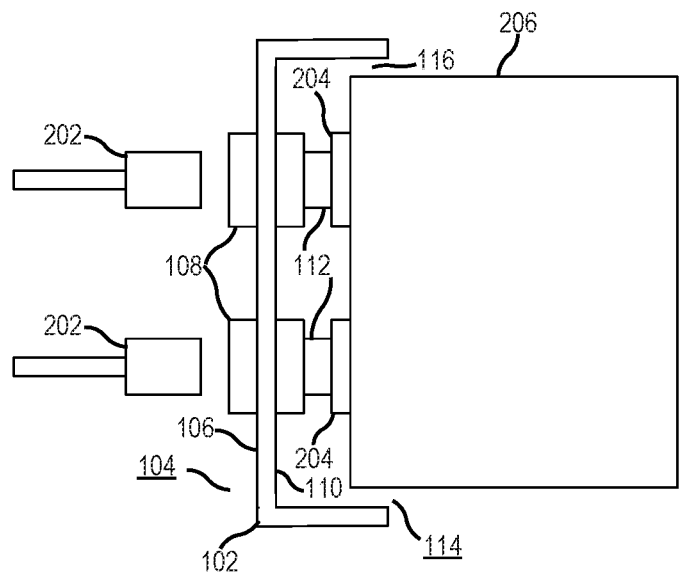

FIGS. 2A and 2B are block diagrams of a dock 102 and computing device 206, according to examples. Further, FIGS. 2A and 2B are side views of the dock 102 and computing device 206. In FIG. 2A, computing device 206 may be considered to be in an undocked position. In other words, the computing device 206 may not be fully inserted into the rack and dock 102. Dock 102 may include a front 104 and a rear 114. The front 104 may include a front side 106 and a rear side 110. The connectors 108 may be disposed on the front side 106. In an example, the connectors 108 may pass through the front side 106 to the rear side 110. In another example, the front of the connectors 108 may sit flush with (in other words, even with) the front side 106. In another example, the back of the connectors 108 may sit flush with (in other words, even with) the front side 106. As noted, the connectors 108 may allow for insertion of external cables 202.

In another example, the rear side 110 may include a plurality of extenders 112. In an example, the extenders 112 may not be disposed in the rear side 110, but rather may be removably or permanently connected to the connectors 108. In another example, the connectors 108 and extenders 112 may be one component each (in other words, one component per each connector and each extender pair). In another example, the extender 112 may or may not be the same as the type of external cable 202 utilized. In another example, the extenders 112 may insert into or may be accepted by the ports 204 of the computing device 206

In FIG. 2B, computing device 206 may be considered to be docked or fully inserted into a rack with the dock 102. In such examples, the extenders 112, as noted above, may be inserted into the ports of the computing device 206. In another example the dock 102 may include a latch, fastener, or aperture. In a further example the latch, fastener, or aperture of the dock 102 may align with a corresponding latch, fastener, or aperture of the computing device 206. When the computing device 206 is fully inserted into the dock 102, the latch, fastener, or aperture (along with a screw or some other fastener) on the dock 102 may secure the dock 102 to the computing device 206.

In another example, when the computing device 206 is fully inserted into the rack with dock 102, the dock 102 may partially enclose the computing device 206. In another example, when the computing device 206 is fully inserted into the rack with dock 102, the dock 102 may fully enclose the computing device 206. In another example, when the computing device 206 is fully inserted into the rack with dock 102, the dock 102 may not enclose the computing device at all (as will be shown and described below in regards to the faceplate below).

Figure 3A:
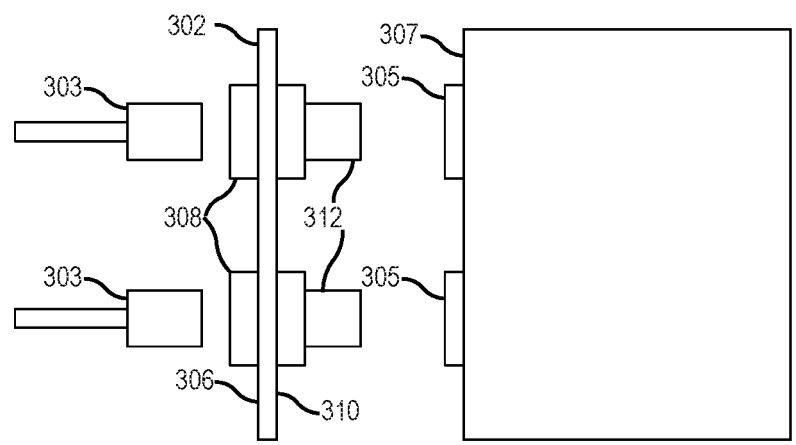
FIGS. 3A and 3B are block diagrams of a faceplate and computing device, according to examples.
Figure 3B:
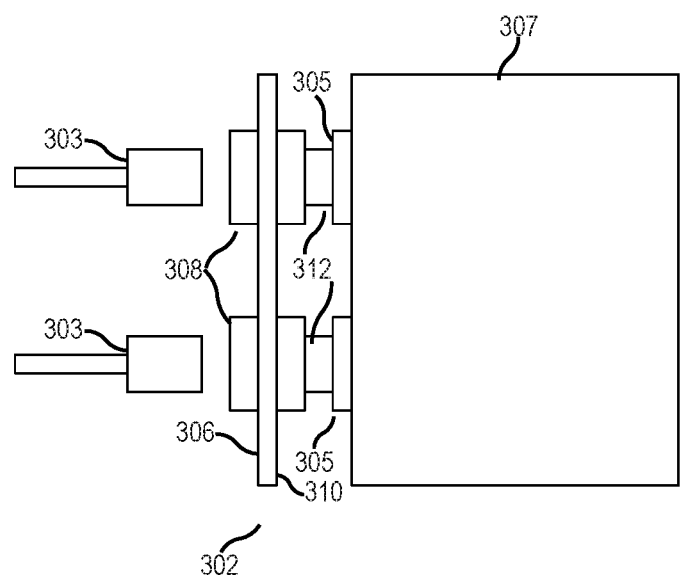

FIGS. 3A and 3B are block diagrams of a faceplate 302 and computing device 307, according to examples. Further, FIGS. 3A and 3B are side views of the faceplate 302 and computing device 307. In FIG. 3A computing device 307 may be considered to be in an undocked position. In other words, the computing device 307 may not be fully inserted into the rack with the faceplate 302. As noted above, the dock may be a faceplate 302. In other words, when the computing device 307 is fully inserted into the rack with faceplate 302, the faceplate 302 may not enclose the computing device at all. Stated another way, the faceplate 302 may not include an upper and lower side or wall.

In an example, the faceplate 302 may include connectors 308 disposed on the front side 306 or through the front side 306 to the rear side 310. In an example, the connectors 308 may allow for insertion of varying types of external cables 303. In another example, the rear side 310 may include extenders 312. In example, the extenders 312 may be mounted to the rear side 310, coupled or attached directly to one of the corresponding connectors 308, or electrically coupled to the corresponding connectors 308. In another example, the extenders 312 may correspond to a port 305 or connection point on the computing device 307.

In FIG. 3B, computing device 307 may be considered to be docked or fully inserted into a rack with the faceplate 302. In such examples, the extenders 312, as noted above, may be inserted into the ports 305 or connection points of the computing device 307. In another example the faceplate 302 may include a latch, fastener, or aperture. In a further example, the latch, fastener, or aperture of the faceplate 302 may align with a corresponding latch, fastener, or aperture of the computing device 307. When the computing device 307 is fully attached to the faceplate 302, the latch, fastener, or aperture (along with a screw or some other fastener) on the faceplate 302 may secure the faceplate 302 to the computing device 307.

In another example, the faceplate 302 may secure or fasten to a rack. In such examples, both ends of the faceplate 302, either at the front side 306 or rear side 310, may include a latch, fastener or aperture. In an example, a latch or fastener may attach, fasten, or connect to some corresponding point on a rack. In another example, an aperture may align with corresponding apertures on the rack. In such examples, when both apertures are aligned a user may, via a fastener (for example, a screw or thumbscrew), secure the faceplate 302 to a rack. In another example, the faceplate 302 may secure or fasten to an enclosure, chassis, or blade enclosure.

In another example, the dock 102 or the faceplate 302 may include circuitry or a device on the docks 102 rear side 110 or the faceplates 302 rear side 310. As noted above, the circuitry or device may connect to the computing device 206, 307 to allow for management of the dock 102 or faceplate 302. In another example, the circuitry or device may include a port on the front side 106, 306 to allow for a user to connect to the circuitry or device and directly manage the dock 102 or faceplate 306.

Figure 4:
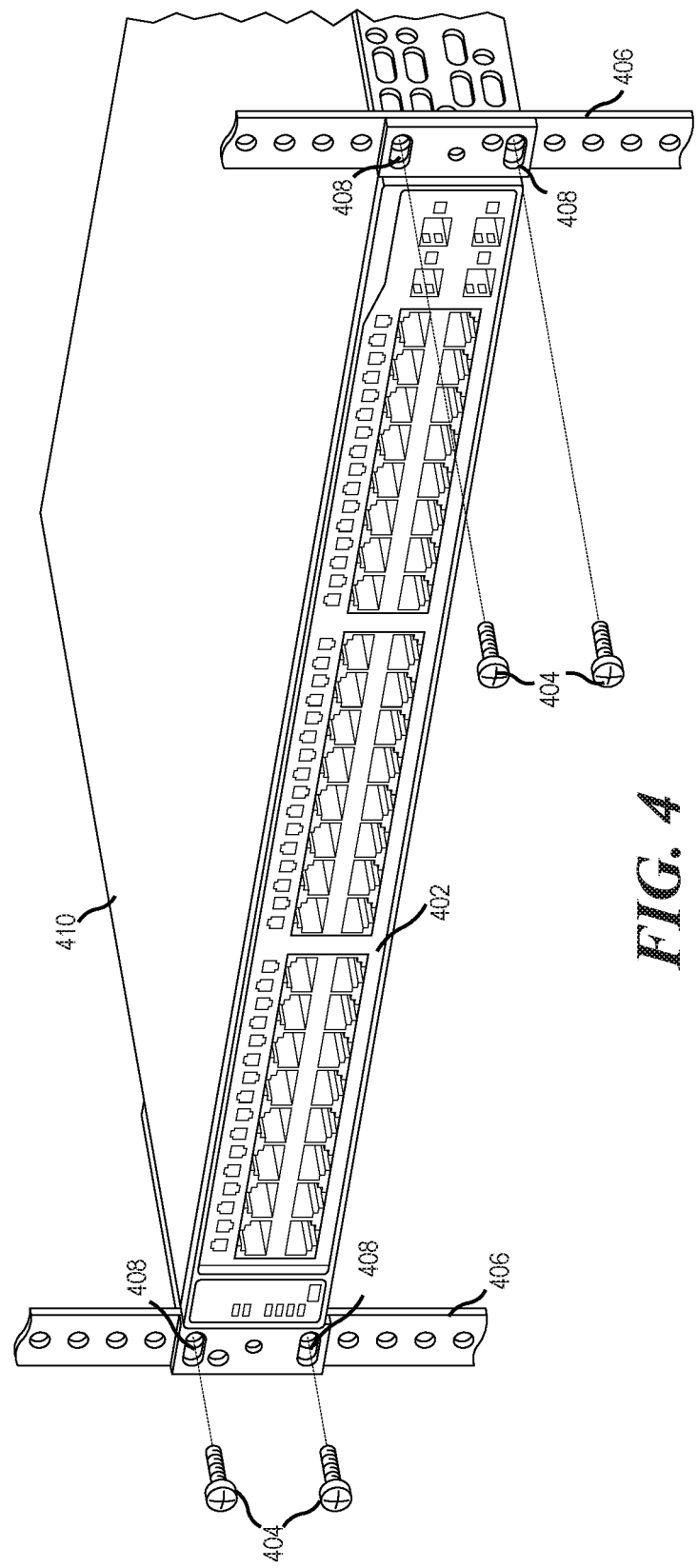
FIG. 4 is a schematic view of a dock and computing device installed in a rack, according to an example.

FIG. 4 is a schematic view of a dock 402 or faceplate and computing device 410 installed in a rack, according to an example. In an example, a rack may include four columns (two of which, columns 406, are shown). Further, the dock 402 or faceplate may include ears with apertures 408. In such examples, the apertures may align with various apertures with threads on columns 406. Further, a user may fasten or thread screws 404 through apertures 408 into the apertures on columns 406. In another example, rather than screws 404, the fastener may be a pin, latch, or some other means to secure the dock 402 or faceplate to columns 406. In another example, rather than apertures 408, the fastener may be integrated or disposed onto the rear side of the dock 402 or faceplate.

FIGS. 5A, 5B, and 5C are schematic views of a faceplate 502, according to an example. In FIG. 5A, a faceplate 502, according to an example, is shown. In such examples, the faceplate 502 may include various apertures 504, 506, 508, 510. Each aperture 504, 506, 508, 510 may allow for the addition of connectors and extenders. In another example, the faceplate 502 may include other apertures in different positions. In such examples, the apertures 504, 506, 508, 510 and other apertures may allow for the addition of connectors and extenders, as well as allow for the addition of a blank. In other words, the blank may be a piece of the same material the faceplate 502 is comprised of. In such examples, the blank may cover an aperture. In another example, a blank may be perforated, to allow for airflow. In another example, the apertures 504, 506, 508, 510 may be populated with a partially blank series of connectors and extenders. In other words, the component to add to an aperture may include some number of connectors and extenders, while the rest may be blank or a blank with perforations.

In FIG. 5B, the faceplate 502 may be populated. In such examples, the apertures may be fitted with various types of connectors 514, 516, 518, 520. For example, connectors 514 and 516 may be a series of Ethernet connectors. Other connectors may be utilized. For example, a connector 520 may include an Ethernet connector and USB connector. Other variations may include varying amounts of connectors and of blank space. In FIG. 5C, the faceplate 502 may be populated and attached to a computing device 512.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be examples. Structure and acts described herein are replaceable by equivalents, which perform the same function, even if the structure or acts are different, as known in the art. Therefore, the scope of the present disclosure is limited only by the elements and limitations as used in the claims

What is claimed is:

1. A system comprising:
  a dock, the dock comprising:
    a front including:
      a front side, wherein a plurality of connectors are disposed on the front side and wherein the plurality of connectors accept external cables;
      a rear side, wherein the rear side includes a plurality of extenders and wherein each one of the plurality of extenders connects to each one of the plurality of connectors; and
      management circuitry coupled to the plurality of connectors on the front side and the plurality of extenders on the rear side, wherein the management circuitry is to monitor functionality of the connectors and/or extenders, and wherein the management circuitry is coupled to a management port situated on the front side, thereby facilitating external management of the dock; and
    a rear including an aperture to allow for insertion of a computing device comprising a plurality of connectors, wherein respective extender corresponds with and connects to a connector on the computing device.

2. The system of claim 1, wherein the computing device is a switch.

3. The system of claim 1, wherein the dock is a faceplate.

4. The system of claim 1, wherein the dock toollessly secures to a rack.

5. The system of claim 1, wherein the dock securely fastens to a rack.

6. The system of claim 1, wherein the dock includes a fastener corresponding to a fastener on the computing device.

7. The system of claim 6, wherein, when the plurality of extenders connect to connectors on the computing device, the dock toollessly secures, via the fastener and the corresponding fastener on the computing device, to the computing device.

8. The system of claim 1, wherein the front side includes a plurality of cutouts to accept connectors with various connector configurations.

9. The system of claim 1, wherein the dock accepts a plurality of computing devices.

10. The system of claim 1, wherein the dock maintains configuration data of external cables when the computing device is removed from the dock.

11. The system of claim 1, wherein the dock communicates with the computing device via a management connection and machine-readable instructions.

12. A dock comprising:
  a front including:
    a front side, wherein a plurality of connectors are disposed on the front side and wherein the plurality of connectors accept external cables;
    a rear side, wherein the rear side includes a plurality of extenders and wherein each one of the plurality of extenders connects to each one of the plurality of connectors; and
    management circuitry coupled to the plurality of connectors on the front side and the plurality of extenders on the rear side, wherein the management circuitry is to monitor functionality of the connectors and/or extenders, and wherein the management circuitry is coupled to a management port situated on the front side, thereby facilitating external management of the dock; and
  a rear including an aperture to allow for insertion of a computing device comprising a plurality of connectors, wherein a respective extender corresponds with and connects to a connector on the computing device; and
  wherein the management circuitry is to maintain configuration data of the external cables when the computing device is removed from the dock.

13. The dock of claim 12, wherein the computing device is a switch, and wherein when the switch is inserted into the dock, the management circuitry connects to the switch.

14. The dock of claim 13, wherein the switch communicates with the management circuitry via a software interface.

15. The dock of claim 14, wherein the software interface is enabled via software drivers installed on the management circuitry and the switch.

16. The dock of claim 15, wherein the software driver indicates specific instructions for the switch to follow when inserted into the dock.

\* \* \* \* \*